United States Patent [19]

Benzinger et al.

[11] Patent Number: 4,663,597

[45] Date of Patent: May 5, 1987

[54] RC COUPLING FILTER, ESPECIALLY AN INPUT FILTER, FOR RECEIVERS OF CENTRALIZED RIPPLE CONTROL SYSTEMS

[75] Inventors: Hans Benzinger, Rheurdt; Erich Rainer, Duisburg, both of Fed. Rep. of Germany

[73] Assignee: Thielscher Electronic GmbH, Duisburg, Fed. Rep. of Germany

[21] Appl. No.: 809,794

[22] Filed: Dec. 17, 1985

[51] Int. Cl.⁴ .................................. H03F 1/34
[52] U.S. Cl. ............................ 330/107; 330/303; 330/306
[58] Field of Search ............... 330/107, 109, 294, 302, 330/303, 306; 333/214

[56] References Cited

U.S. PATENT DOCUMENTS 3,936,777  2/1976  Rollett et al. ............... 333/214 X
4,147,997  4/1979  Greaves ...................... 330/107 X
4,551,686 11/1985  Benzinger .................... 330/100

FOREIGN PATENT DOCUMENTS 2436966  5/1977  Fed. Rep. of Germany.

Primary Examiner—James B. Mullins
Attorney, Agent, or Firm—Sixbey, Friedman & Leedom

[57] ABSTRACT

A RC coupling filter, especially an input filter for receivers of centralized ripple control systems, with at least two similar active RC four terminal networks with at least one amplifier each, each four terminal network having an input and every two adjacent RC four terminal networks being interconnected by means of exactly one coupling admittance connected between the inputs of the adjacent RC four terminal network, wherein, if the signal to be filtered is introduced into the input of the first RC four terminal network, a feeding admittance is connected at one end to the input of the first RC four terminal network, the signal to be filtered being introduced into the other end of the feeding admittance.

8 Claims, 4 Drawing Figures

RC COUPLING FILTER, ESPECIALLY AN INPUT FILTER, FOR RECEIVERS OF CENTRALIZED RIPPLE CONTROL SYSTEMS

TECHNICAL FIELD

The invention relates to RC coupling filters generally, and particularly to an input filter for receivers of centralized ripple control systems, with at least two similar active RC four terminal networks being interconnected by means of coupling admittances. Particularly this invention relates to an improvement of the RC coupling filters disclosed in U.S. Pat. No. 4,551,686 of applicant.

BACKGROUND ART

A RC coupling filter in the form of a bandpass filter with two active RC filters is known from German Pat. No. 24 36 966. Although excellent results have been obtained with this double circuit RC coupling filter, it has been considered that further improvement in the properties could be achieved through series connection of several such double circuit RC coupling filters, and in particular an improved response time in comparison to a single double circuit RC coupling filter. Application of series connection of such double circuit RC coupling filters does, of course, create the problem that the coupling factors between the individual double circuit RC coupling filters are not determined by the relationship of the coupling components substantially or objectively present. Hence the problems connected with coupling factors which are eliminated with such series connections reappear to a certain extent, since the detuning coupling factors between the individual series components are as small differences in high frequencies very sensitive to variations in the elements.

In view of the above prior art a multiple circuit (n-circuit, with n≧2) RC coupling filter was developed in which optimum selectivity and the shortest possible response times are combined with high stability (insensitivity to the coupling components employed) (U.S. Pat. No. 4,551,686).

In this RC coupling filter, especially an input filter for receivers of centralized ripple control systems, a multiplicity (n, with n≧2) of similar four terminal networks was provided each four terminal network having an input and an output and every two adjacent four terminal networks being interconnected by means of two coupling admittances, wherein active RC four terminal networks with at least one amplifier were provided as four terminal networks, the output of the first RC four terminal network being connected by way of a coupling admittance to the input of the second RC four terminal network and the input of the first RC four terminal network being connected by way of another coupling admittance to the output of the second RC four terminal network, wherein, except for the first RC four terminal network and the last RC four terminal network, the input of each RC four terminal network was connected on the one hand by way of a coupling admittance to the output of the preceding RC four terminal network, and on the other, by way of another coupling admittance to the output of the following RC four terminal network, and the output of each RC four terminal network was connected, on the one hand, by way of a coupling admittance to the input of the preceding RC four terminal network, and on the other, by way of another coupling admittance, to the input of the following RC four terminal network and wherein the output of the last RC four terminal network was connected by way of a coupling admittance to the input of the next to last RC four terminal network and the input of the last RC four terminal network was connected by way of another coupling admittance to the output of the next to last RC four terminal network. Unless expressly stated otherwise, when reference is made here and in what follows to an amplifier input, the inverting input of the amplifier is meant. Unless expressly stated otherwise, the noninverting input of the amplifier is in this case connected to the ground.

A RC coupling filter of prior art as indicated in the foregoing makes it possible to use virtually all types of RC four terminal networks. The type of RC four terminal network employed then defines the nature of the entire RC coupling filter. In point of stability, the RC coupling filter is absolutely equivalent to the state of the art (German No. 24 36 966) double circuit RC bandpass filter of the type previously indicated, since all coupling factors represent quotients of coupling components of the same type, so that variations in the coupling components employed have virtually no effect on the coupling factors. It is an aspect of particular significance that all the coupling admittances can be embodied in passive coupling components, specifically, coupling resistances or coupling capacitors.

In this known RC coupling filter each active RC four terminal network preferably has a bypass admittance, two filter admittances, a feedback admittance, and an amplifier. One end of the bypass admittance and of the filter admittances are connected to each other and to the input of the RC four terminal network, and one end of the feedback admittance is connected to the other end of the first filter admittance and to the input of the amplifier. The remaining ends of the second filter admittance and of the feedback admittance, as well as the output of the amplifier, are connected to each other and to the output of the RC four terminal network.

Normally with this prior art RC coupling filter (U.S. Pat. No. 4,551,686) the signal to be filtered is fed into the first RC four terminal network, while output of the filtered signal takes place in the last RC four terminal network. The same alternatives as for the input circuits for the state of the art (German No. 24 36 966) double circuit RC coupling filters apply to the input circuits, which in many cases have an input current converter. In many cases the signal to be filtered is introduced directly into the inverting input of the amplifier of the first RC four terminal network. It may be advantageous, however, if the signal to be filtered is introduced into the noninverting input of the amplifier of the first RC four terminal network. This ensures that the symmetry of the RC four terminal networks is not disrupted by the input. It has already been pointed out that the admittances generally can be embodied in resistances or capacitances. The admittances may be embodied in ohmic resistances or in capacitors in keeping with the filter characteristics which it is desired to obtain. If, for example, for the purpose of design as a bandpass the bypass admittance and the feedback admittance in each RC four terminal network are embodied in ohmic resistances and the filter admittances in capacitors, it is advisable for the coupling admittances to be embodied in capacitors.

In a further aspect of the prior art if the RC coupling filter is designed as a bandpass filter, it may be treated as a truly closed reactance four terminal network, provided that the RC four terminal networks, except the first RC four terminal network and the last RC four terminal network, are fully loss compensated. Loss compensation such as this of the "internal" RC four terminal networks can be accomplished by connecting the non-inverting input of the amplifier of each RC four terminal network, except the first RC four terminal network and last RC four terminal network, by way of a first tuning admittance to the output of the amplifier and by way of a second tuning admittance to the ground. The tuning admittances are in this case preferably embodied in ohmic resistances. The tuning admittances can be adjusted so that the internal losses of the corresponding RC four terminal networks become negligibly small. Hence the "interior" RC four terminal networks are in effect fully loss compensated, so that the number of pole losses can be reduced to two. The RC coupling filter, as a narrow bandpass filter, is thus considerably more stable than any other comparable circuit.

In an alternative aspect of the prior art to the embodiment indicated in the foregoing, with appropriate tuning admittances in the "interior" RC four internal networks, a truly closed reactance four terminal network can also be produced if each of the RC four terminal networks is designed as a resonator with two amplifiers the inverting inputs of which are interconnected. Resonators of this type are already known as such. They have extremely low losses, and thus very slight attenuation at the corresponding frequency. In addition, such resonators are even more insensitive to variations in the elements, and thus are even stabler, since they have a very high open loop voltage gain because of the two amplifiers.

A still further aspect of the prior art is to provide additional circuit potential by designing each RC four terminal network as a multiple stage universal circuit, preferably with a summing stage, two integrating stages, and an inverting stage. A multiple stage universal circuit such as this presents the advantage that the possible inputs and outputs are assigned in advance. Different filter characteristics can be obtained through selection of different inputs or outputs. Such universal circuits are known, for example, as integrated capacitor switch filters in CMOS technology. Such capacitor switch filters have a clock crystal and are thus frequency constant to an extreme degree. Optimum utilization of the advantageous embodiment of the RC coupling filter with the highly stable coupling factor can be achieved precisely with these filters.

In the prior art through appropriate adjustment of the individual admittances in keeping with the design, one may produce all special types of filters such as Bessel filters, Butterworth filters, Tschebyscheff filters, and so forth.

The prior art RC coupling filter as explained above in detail (U.S. Pat. No. 4,551,686) needs a comparably large number of coupling admittances, particularly coupling capacitors. For example with the minimum of two active RC four terminal networks two coupling admittances are necessary. With n RC four terminal networks the number of $(n-1)\cdot 2$ coupling admittances is necessary. This is not only complicated as far as circuitry is concerned but also considerably expensive.

OBJECT OF THE INVENTION

A primary object of the invention is the development of an RC coupling filter with at least two active RC four terminal networks, which is simplified in circuitry and less expensive in comparison with the prior art RC coupling filter, but shows the same selectivity, response times and high stability as that prior art RC coupling filter.

DISCLOSURE OF THE INVENTION

This and other objects of the invention are attained, in accordance with the invention, with an RC coupling filter, especially an input filter for receivers of centralized ripple control systems, with at least two similar active RC four terminal networks with at least one amplifier each, each RC four terminal network having an input and every two adjacent RC four terminal networks being interconnected by means of exactly one coupling admittance connected between the inputs of the adjacent RC four terminal networks, wherein, if the signal to be filtered is introduced into the input of the first RC four terminal network, a feeding admittance is connected at one end to the input of the first RC four terminal network, the signal to be filtered being introduced into the other end of the feeding admittance.

In a further aspect of the invention the coupling admittances are embodied in capacitors, which is a preferable way of construction for the purpose of design as a bandpass with the filter admittances in the RC four terminal networks being embodied in capacitors.

The essential aspect of the invention is the fact that a coupling from input to input of adjacent RC four terminal networks by exactly one coupling admittance will lead to the same positive characteristics of the RC coupling filter as the interlaced feedbacks with two parallel coupling admittances each in the prior art. In point of stability the RC coupling filter of this invention is absolutely equivalent to the prior art RC coupling filter, since all coupling filters represent quotients of coupling components of the same type, so that variations in the coupling components employed have virtually no effect on the coupling factors.

If the signal to be filtered is introduced into the input of the first RC four terminal network of the RC coupling filter according to the invention, it is important that this is done via a feeding admittance to obtain an ac-voltage division. Nevertheless, even with the RC coupling filter according to the invention the signal to be filtered may be introduced into the noninverting input of the amplifier of the first RC four terminal network. This ensures that the symmetry of the RC four terminal networks is not disrupted by the input. Generally as for the input circuits the same alternatives as in the prior art apply here.

In a further aspect of the invention identical characteristics with the prior art RC coupling filter are obtained by designing an RC coupling filter according to the invention wherein the electrical value of the one coupling admittance between two adjacent RC four terminal networks is the sum of the electrical values of the two coupling admittances between two adjacent RC four terminal networks in the prior art. Particularly the value of the coupling capacitor between two adjacent RC four terminal networks should equal twice the value of the prior art coupling capacitors.

With reference to the drawings illustrating examples of the prior art in comparison with examples of the invention the invention is described:

DETAILED DESCRIPTION OF THE DRAWINGS

Figure 1:
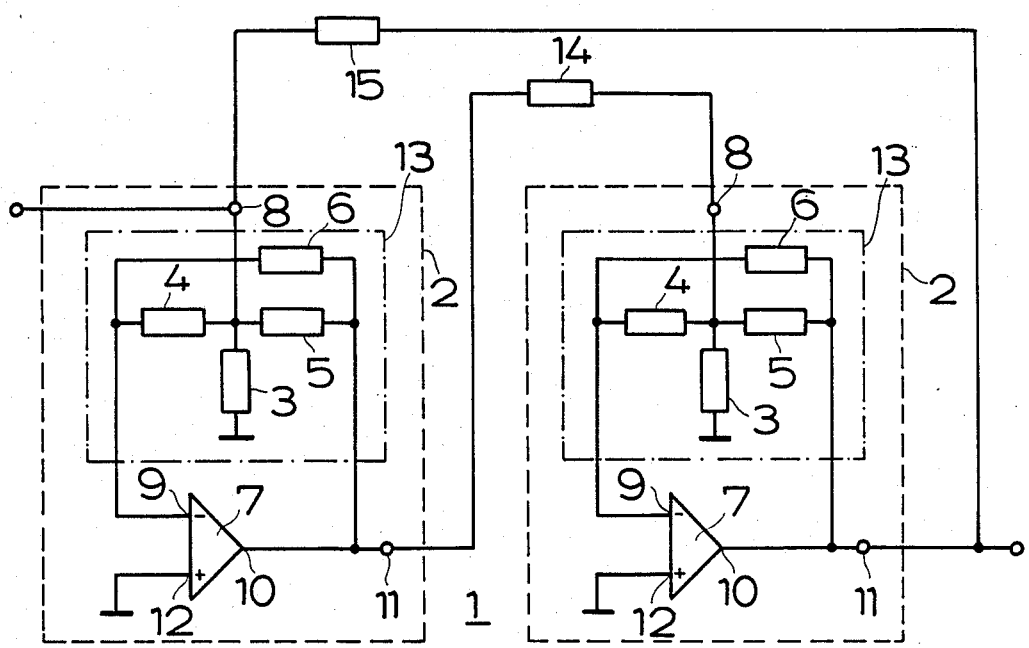
FIG. 1 shows a connection diagram of a two-circuit RC coupling filter of prior art with active RC four terminal networks comprising one amplifier each.

In FIG. 1 a connection diagram of a two-circuit RC coupling filter of the prior art is shown. Nevertheless, basically, this prior art refers to similarly constructed n-circuit RC coupling filters with, then, interlaced feedbacks.

As is to be seen from FIG. 1, the coupling filter 1 has two active RC four terminal networks 2 of the same type. Each RC four terminal network 2 has a bypass admittance 3, two filter admittances 4, 5, a feedback admittance 6, and an amplifier 7 (operational amplifier here). The bypass admittance 3 and the filter admittances 4, 5 are connected at one end to each other and to the input 8 of the RC four terminal network 2. The feedback admittance 6 is at one end connected to the other end of the first filter admittance 4 and to the input (inverting input) 9 of the amplifier 7. The other ends of the second filter admittance 5 and of the feedback admittance 6, as well as the output 10 of the amplifier 7, are connected to each other and to the output 11 of the RC four terminal network 2. In addition, in the embodiment shown the noninverting input 12 of the amplifier 7 is connected to the ground. The bypass admittance 3, the filter admittances 4, 5 and the feedback admittance 6 together make up the negative feedback admittance 13.

Basically, n active RC four terminal networks 2 as shown in FIG. 1 may be assembled to form an n-circuit RC coupling filter 1. In FIG. 1 two active RC four terminal networks 2 are interconnected by way of two coupling admittances 14, 15. In particular, the input 8 of the second RC four terminal network 2 is connected by way of the coupling admittance 14 to the output 11 of the first RC four terminal network 2 and the output 11 of the second RC four terminal network 2 is connected by way of the coupling admittance 15 to the input 8 of the first RC four terminal network 2.

With more than two RC four terminal networks 2 the RC four terminal networks 2 so to speak form a continuous chain with interlaced feedbacks by way of the coupling admittances 14 and 15. Like the bypass admittance 3, the filter admittances 4, 5, and the feedback admittance of each RC four terminal network 2, so also the coupling admittances 14, 15 may be designed as resistances or as capacitors.

As is clearly shown in FIG. 1, in the RC coupling filter 1 here illustrated, the signal to be filtered is introduced directly into the input 8 of the first RC four terminal network 2. Nevertheless the signal to be filtered may be introduced into the noninverting input of the amplifier of the first RC four terminal network, specifically, by way of an input voltage divider by means of a signal source. The filtered signal is tapped at the output 11 of the last RC four terminal network 2.

For the purpose of design as a bandpass filter, the bypass admittance 3 and the feedback admittance 6 may each be embodied in ohmic resistances, and the filter admittances 4, 5 in capacitors. In this case, however, the coupling admittances 14, 15 must also be embodied in capacitors.

The coupling factors $k_{m,m+1}$ represent quotients of elements of the same type and are thus highly stable towards variation in the elements. In the present case, for example, for $k_{m,m+1}$ we have:

$$k_{m,m+1} = \frac{C_{m,m+1}}{C} \frac{C_{m,m+1}}{\sqrt{C_{m5} \cdot C_{(m+1)5}}}.$$

$C_{m,m+1}$ in this case denotes the capacitance of the capacitor functioning as coupling admittance between the m-th RC four terminal network $2_m$ and the (m+1)-th RC four terminal network $2_{m+1}$, and $C_{m5}$ and $C_{(m+1)5}$ respectively represent the capacitances of the corresponding filter admittances $5_m$ and $5_{m+1}$ between the input 8 and the output 11 of the corresponding RC four terminal network $2_m$ or $2_{m+1}$.

In the present case of prior art shown in FIG. 1 for this two-circuit RC coupling filter holds:

$$k_{14} = \frac{C_{14}}{C_5} ; k_{15} = \frac{C_{15}}{C_5}.$$

In this case the capacitances of the filter admittances 5 of both RC four terminal networks 2 are taken as equal and much larger than the capacitances of coupling admittances 14, 15. If the capacitances of the filter admittances 5 are not much larger than the capacitances of the coupling admittances 14, 15 the denominator should read $(C_5+C_{14})$ or $(C_5+C_{15})$. The above-given equation as well as the general equation for $C_{m,m+1}$ is based on this approximation.

Figure 2:
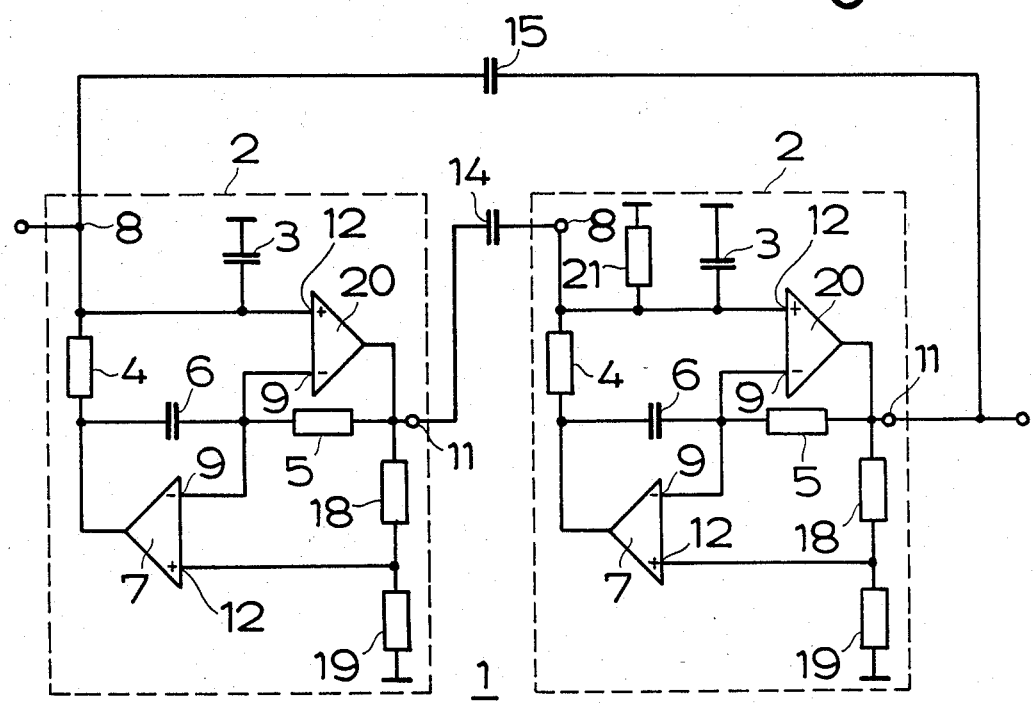
FIG. 2 shows a connection diagram of a two-circuit RC coupling filter of prior art with active RC four terminal networks comprising two amplifiers each and designed as resonators.

FIG. 2 shows the connection diagram of an RC coupling filter 1 of prior art with RC four terminal networks 2 designed as resonators. The same reference symbols have been employed to the extent that the elements of the circuit correspond approximately to the elements already described. The RC four terminal network 2 designed as a resonator has two amplifiers 7, 20 the inverting inputs 9 of which are interconnected. The RC four terminal networks 2 illustrated in FIG. 2 have an additional distinctive feature in that the noninverting input 12 of the amplifier 7 is connected by way of a first tuning admittance 18 to the output 11 and by way of a second tuning admittance 19 to the ground. Tuning admittances 18, 19 are, in this instance, embodied in ohmic resistances. With this the internal losses may be rendered negligibly small through adjustment of the tuning admittances 18, 19.

In FIG. 2, further, the RC four terminal networks 2 can be loss compensated in a simple manner by omitting the input resistance 21, if such is required. If the input resistance 21 is present, it must be connected to the ground parallel to the bypass admittance 3. Only in the case of the first RC four terminal network 2 the input resistance 21 is not connected to the ground, since the signal to be filtered is introduced by way of this resistance.

The above explained prior art RC coupling filter 1 with RC four terminal networks 2 designed as resonators shows the following equation for the coupling factors (for a two-circuit coupling filter):

$$k_{14,15} = \left(1 + \frac{R_{18}}{R_{19}}\right) \cdot \frac{C_{14,15}}{C_3 + C_{14,15}}.$$

In this equation $C_{14}=C_{15}$ is assumed. Further if $R_{18}=R_{19}$ and $C_{14,15}$ is small in comparison with $C_3$, above equation reads $$k_{14,15} = \frac{2 \cdot C_{14,15}}{C_3}.$$

Figure 3:
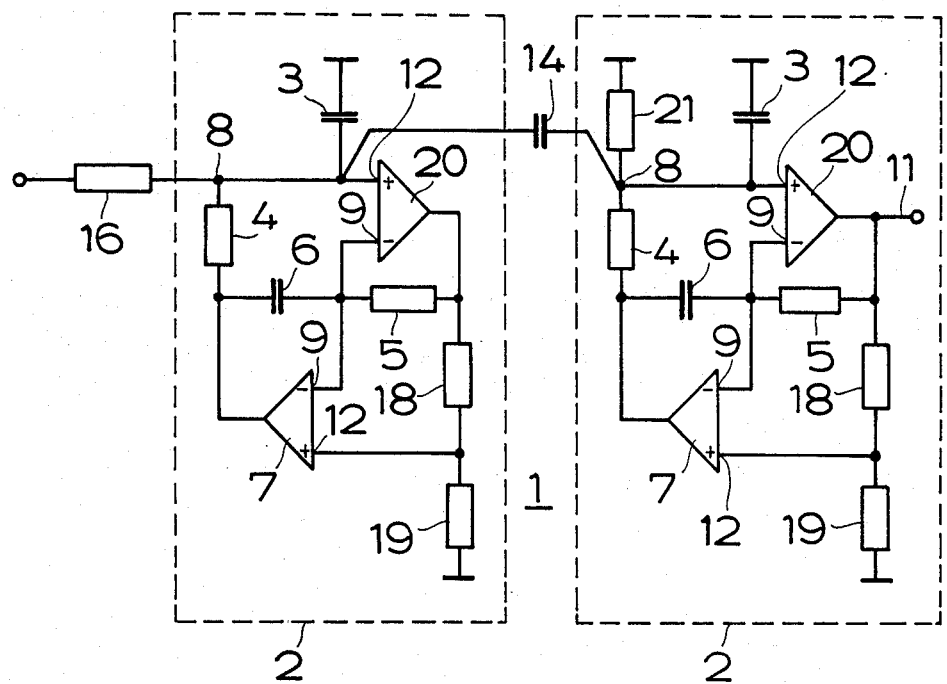
FIG. 3 shows a connection diagram of a preferred embodiment of a two-circuit RC coupling filter of the invention with active RC four terminal networks, the active RC four terminal networks being equivalent to those shown in FIG. 2.

FIG. 3 now shows an embodiment of a RC coupling filter 1 according to the invention, which is an two-circuit coupling filter. This RC coupling filter 1 shows active RC four terminal networks 2 designed as resonators, each provided with two operational amplifiers 7, 20. Those resonators are explained above with reference to FIG. 2 and need no additional explanation here.

As FIG. 3 shows according to the invention both RC four terminal networks 2 are interconnected or coupled by means of exactly (only) one coupling admittance 14 connected between the inputs 8 of the RC four terminal networks 2. The introduction of the signal to be filtered is done at the input 8 of the first RC four terminal networks 2 via a feeding admittance 16. In the embodiment shown in FIG. 3 the feeding admittance 16 is embodied in an ohmic resistance whereas the coupling admittance 14 is embodied in a capacitor.

The following equation holds for the coupling factor of the two circuit RC coupling filter 1 shown in FIG. 3:

$$k_{14} = \frac{C_{14}}{C_3 + C_{14}}.$$

In case that $C_{14}$ (as usual) is very small compared with $C_3$ and in case that the value of the capacitance of coupling admittance 14 is equal to the sum of the values of the capacitances of the two coupling admittances 14, 15 of prior art, i.e. $C_{14,inv.}=2 \cdot C_{14,15}$, p.a. This results in exactly the coupling factor of the prior art in FIG. 2d. Although one full coupling admittance, i.e. the coupling admittance 15 of the prior art, is saved, the RC coupling filter 1 in FIG. 3 has exactly the perfect characteristics of the prior art RC coupling filter 1 in FIG. 2. In result the RC coupling filter 1 of the invention is substantially cheaper and simpler in circuitry as the prior art RC coupling filter 1.

Figure 4:
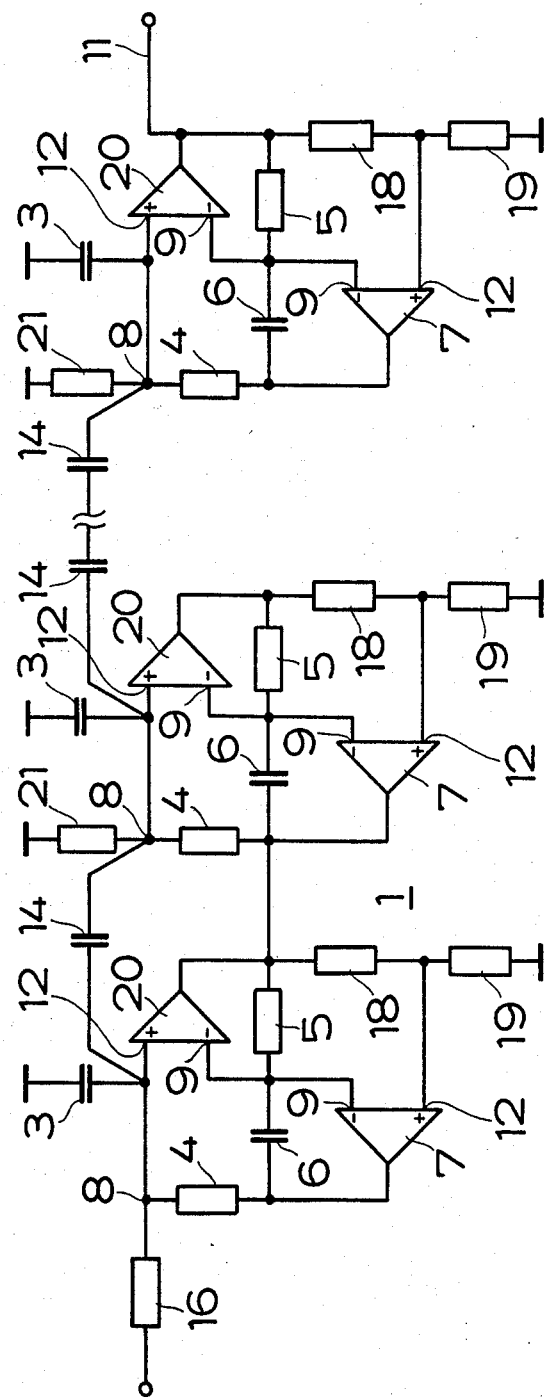
FIG. 4 shows a connection diagram of a preferred embodiment of a multiple circuit RC coupling filter of the invention with active RC four terminal networks, the active RC four terminal networks being equivalent to those shown in FIG. 2.

In FIG. 4 an n-circuit RC coupling filter 1 according to the invention is shown, constructed similarly to the RC coupling filter in FIG. 3. Generally this connection diagram may be understood easily with referenced to the above given explanations. Instead of interlaced feedbacks with two parallel coupling admittances 14, 15 between each adjacent RC four terminal networks 2 here surprisingly simple straight forward feedbacks by means of exactly one coupling admittance 14 connected between the inputs 8 of each adjacent RC four terminal networks 2 are provided. In FIG. 4 the signal to be filtered is introduced into the input 8 of the first RC four terminal network 2 via a feeding admittance 16 connected at one end to the input 8 of the first RC four terminal network 2. Nevertheless it is basically possible to introduce the signal to be filtered into the noninverting input of the amplifier of the first RC four terminal network.

It is to be observed that the above explanation of the invention is given as a matter of example only without any restrictive object with regard to the scope of protection given by the following claims.

We claim:

1. A coupling filter, esspecially an input filter for receivers of centralized ripple control systems, comprising;
   a plurality of similar four terminal networks, each one of said plurality of four terminal networks having an input and an output;
   every two adjacent four terminal networks being interconnected by no more than a single coupling admittance;
   each one of said plurality of four terminal networks being an active RC four terminal network having at least one amplifier;
   wherein said single coupling admittances are connected between the inputs of each two adjacent RC four terminal networks; and
   wherein the input of the first RC four terminal network is connected to a feeding admittance.

2. The coupling filter as claimed in claim 1, wherein with respect to each pair of adjacent four terminal networks the input of the first of each said pair of four terminal networks is uncoupled with respect to the output of the second of each said pair of four terminal networks.

3. The coupling filter as claimed in claim 1, wherein the signal to be filtered is introduced into the noninverting input of the amplifier of the first RC four terminal network.

4. The coupling filter as claimed in claim 3, wherein each four terminal network includes a second amplifier, the noninverting input of the second amplifier of each RC four terminal network is connected by way of a first tuning admittance to the output of the first amplifier and by way of a second tuning admittance to the ground.

5. The coupling filter as claimed in claim 4, wherein the tuning admittances are embodied in ohmic resistances.

6. The coupling filter as claimed in claim 3, wherein each RC four terminal network is designed as a resonator with two amplifiers, the inverting inputs thereof being interconnected.

7. The coupling filter as claimed in claim 1, wherein each four terminal network includes a second amplifier, the noninverting input of the second amplifier of each RC four terminal network is connected by way of a first tuning admittance to the output of the first amplifier, and by way of a second tuning admittance, to the ground.

8. The coupling filter as claimed in claim 1, wherein each RC four terminal network is designed as a resonator with two amplifiers, the inverting outputs of which are interconnected.

* * * * *